United States Patent
Hergeth

(10) Patent No.: US 10,710,604 B2
(45) Date of Patent: Jul. 14, 2020

(54) METHOD AND DEVICE FOR DEACTIVATING A DRIVER ASSISTANCE SYSTEM

(71) Applicant: Bayerische Motoren Werke Aktiengesellschaft, Munich (DE)

(72) Inventor: Sebastian Hergeth, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 118 days.

(21) Appl. No.: 16/131,829

(22) Filed: Sep. 14, 2018

(65) Prior Publication Data

US 2019/0009791 A1 Jan. 10, 2019

(30) Foreign Application Priority Data

Mar. 16, 2016 (DE) .................. 10 2016 204 343

(51) Int. Cl.
*B60W 50/08* (2020.01)
*B62D 1/28* (2006.01)
(Continued)

(52) U.S. Cl.
CPC .......... *B60W 50/082* (2013.01); *B60W 50/10* (2013.01); *B62D 1/046* (2013.01);
(Continued)

(58) Field of Classification Search
CPC .............. B60W 50/082; B60W 50/10; B60W 2420/10; B60W 2540/00; B62D 1/286;
(Continued)

(56) References Cited

U.S. PATENT DOCUMENTS

| | | | | |
|---|---|---|---|---|
| 5,335,743 A | * | 8/1994 | Gillbrand | B60K 20/02 180/170 |
| 2008/0042856 A1 | * | 2/2008 | Power | G08B 21/06 340/575 |

(Continued)

FOREIGN PATENT DOCUMENTS

| | | |
|---|---|---|
| DE | 195 18 914 A1 | 12/1995 |
| DE | 198 02 249 A1 | 9/1999 |

(Continued)

OTHER PUBLICATIONS

German Search Report issued in counterpart German Application No. 10 2016 204 343.9 dated Mar. 6, 2017 with partial English translation (ten (10) pages).
International Search Report (PCT/ISA/210) issued in PCT Application No. PCT/EP2017/052772 dated Apr. 26, 2017 with English translation (four (4) pages).
German-language Written Opinion (PCT/ISA/237) issued in PCT Application No. PCT/EP2017/052772 dated Mar. 16, 2016 (six (6) pages).

*Primary Examiner* — Jaime Figueroa
(74) *Attorney, Agent, or Firm* — Crowell & Moring LLP

(57) ABSTRACT

A method and a device are provided for deactivating a driver assistance system for autonomous transverse guidance of a vehicle, which driver assistance system has a sensor unit for detecting a contact with the rim of a steering wheel by a driver, and a control unit which detects, via the detected contact, a request by the driver to transfer from the autonomous transverse guidance into a manual transverse guidance by the driver. The pressure sensor constitutes at least one pressure sensor, which extends over at least that part of the surface of the steering wheel rim which is usually touched by the driver's hands. It does not extend over the area of the surface of the steering wheel rim which, viewed in a cross section of the steering wheel rim, describes an approximately circular-segment-shaped arc which extends over a sector angle of the order of magnitude of 90°, which arc is spaced apart as far as possible from the center point of the steering wheel.

10 Claims, 2 Drawing Sheets

(51) Int. Cl.
*G05D 1/00* (2006.01)
*B60W 50/10* (2012.01)
*B62D 1/04* (2006.01)
*H03K 17/96* (2006.01)

(52) U.S. Cl.
CPC .......... *B62D 1/286* (2013.01); *G05D 1/0061* (2013.01); *G05D 1/0088* (2013.01); *H03K 17/9643* (2013.01); *G05D 2201/0213* (2013.01)

(58) Field of Classification Search
CPC .. B62D 1/046; H03K 17/9643; G05D 1/0088; G05D 1/0061; G05D 2201/0213
USPC ....................................................... 701/1, 23
See application file for complete search history.

(56) References Cited

U.S. PATENT DOCUMENTS

| | | | |
|---|---|---|---|
| 2014/0365076 A1 | 12/2014 | Cash | |
| 2015/0123947 A1* | 5/2015 | Jubner | B62D 1/046 345/175 |
| 2018/0037224 A1* | 2/2018 | Bogner | B60W 50/14 |

FOREIGN PATENT DOCUMENTS

| | | |
|---|---|---|
| DE | 10 2006 023 287 A1 | 12/2007 |
| DE | 10 2013 010 928 A1 | 12/2014 |
| DE | 10 2015 101 563 A1 | 8/2015 |
| EP | 3 040 699 A1 | 7/2016 |

* cited by examiner

METHOD AND DEVICE FOR DEACTIVATING A DRIVER ASSISTANCE SYSTEM

CROSS REFERENCE TO RELATED APPLICATIONS

This application is a continuation of PCT International Application No. PCT/EP2017/052772, filed Feb. 8, 2017, which claims priority under 35 U.S.C. § 119 from German Patent Application No. 10 2016 204 343.9, filed Mar. 16, 2016, the entire disclosures of which are herein expressly incorporated by reference.

BACKGROUND AND SUMMARY OF THE INVENTION

The invention relates to a method and a device for deactivating a driver assistance system for autonomous transverse guidance of a vehicle. As the prior art, reference is made by way of example to DE 10 2006 023 287 A1, and in particular to DE 2015 101 563 A1.

The related prior art discloses many concepts for highly automated driving and the driver assistance systems responsible for them. Thus, for example, driver assistance systems are known which support the driver in the driving task, or even those which cause the vehicle to completely assume control of certain driving tasks, such as the longitudinal and/or transverse guidance of a vehicle. In this case, in safety-critical situations in which the assistance function of the driver assistance systems is no longer adequate, the driver is requested by the driver assistance system to perform the vehicle guidance him/herself. This request is known as a control transfer request. In addition, if desired, the driver is able at any time to intervene in the highly automated task of the driver assistance system, so as to perform the driving task manually. Depending on the driving task which the driver assistance system performs, there are a number of different transfer approaches, thus means or actions, which the driver carries out to indicate that he/she would like to take over the driving task him/herself, and therefore to deactivate the driver assistance system which is performing the highly automated driving task at the time. Thus it is known, for example, to deactivate an ACC (Automatic Cruise Control) system, which performs the longitudinal guidance of the vehicle on highways, by the driver activating a gas- or brake pedal. In highly automated transverse guidance, transfer approaches are known that use interactions with the steering wheel, thus an activation of the steering wheel by the driver. Thus, from DE 10 2015 101 563 A1 for example, a system for automated driving is known, which is deactivated by touching and simultaneous turning of the steering wheel by the driver. To detect whether the driver is touching the steering wheel and turning the steering wheel, capacitive sensors and torque sensors are mounted in the steering wheel. In order to ensure with a high probability that a driver request to assume control from the assistance function has occurred, both sensor signals are required in order to deactivate the driver assistance system. The driver must therefore both touch as well as turn the steering wheel.

Sensors to detect whether the driver's hands are on the steering wheel and how strongly the driver is gripping the steering wheel, are known from other areas of driver assistance technology. Thus, DE 10 2006 023 287 A1 discloses a gripping force sensor for a steering wheel, which is designed as a piezoelectric pressure sensor and by means of which a physical loading state of the driver, such as the effect of fatigue or stress, can be determined.

In highly automated driving, particularly in the case of autonomous transverse guidance, the control transfer approaches are traditionally associated with interventions in the steering by the driver, in other words with an activation of the steering wheel.

A deficiency in the current transfer approaches for autonomous transverse guidance of a driver assistance system known from the prior art is that a transfer from the autonomous transverse guidance into the manual transverse guidance can be triggered by the driver involuntarily, by lightly touching or accidentally turning the steering wheel, for example by the driver's knee resting against the steering wheel. In such situations the driver is not prepared for assuming control of the transverse guidance and therefore is not immediately able to assume the transverse guidance of the vehicle. In unfavorable situations, this may lead to errors due to the inattention of the driver.

The object of the present invention, therefore, is to provide a deactivation or a control transfer concept of a driver assistance system for the autonomous transverse guidance of a vehicle, which is resistant to involuntary or accidental signals of a control transfer request by the driver, for example by the driver resting a knee on the steering wheel, and at the same time is simple to implement.

A method and/or a device for deactivating a driver assistance system for autonomous transverse guidance of a vehicle is proposed, which senses a contact of the steering wheel rim by the driver by means of a pressure sensor according to the invention, detects a control transfer request of the driver and deactivates the driver assistance system.

According to the invention, the said pressure sensor extends over at least part of the surface of the steering wheel rim, which is usually touched by the driver's hands. However, in order to prevent unintentional contacts, which are often caused by knocking or resting against the knees or the legs of the driver, the region of the surface of the steering wheel rim which, viewed in a cross section of the steering wheel rim describes an approximately circular-segment-shaped arc which extends over a sector angle of the order of magnitude of 90°, said arc being spaced apart as far as possible from the center point of the steering wheel, is not covered by the pressure sensor, and/or not monitored with regard to contact.

Depending on the width or the diameter of the steering wheel tube, in other words the gripping area of the steering wheel rim, the said sector angle can vary. Thus, in the case of a broader grip area a sector angle of more than 90° is chosen, and for a narrower grip area an angle of slightly less than 90°.

This free area according to the invention in the coverage of the steering wheel rim by the pressure sensor device, at the outer areas of the steering wheel, when viewed from the steering wheel center, at which in particular the legs or knees of the driver knock or rest against during a change of seating position, prevents any involuntary engagement with the autonomous transverse guidance and thus any involuntary deactivation of the driver assistance system. This allows safety-critical situations described above, in which the driver is not prepared for assuming control of the transverse guidance of the vehicle and may be concentrating on things other than the vehicle guidance, to be avoided.

The initial situation for introducing the method according to the invention is an autonomous transverse guidance of the vehicle by the driver assistance system. In this situation the driver's hands do not touch the steering wheel. If the driver then intends to take control over the transverse guidance of the vehicle, or if the driver assistance system prompts the driver to transfer control, the driver then grips the steering wheel with his/her hands. The pressure sensor device mounted on the steering wheel then senses the contact with the steering wheel by the driver's hands.

In an advantageous embodiment, in this state a control unit is activated, due to the amount of the applied contact pressure, to determine whether a control transfer request or a control transfer attempt has been made by the driver during this contact. Depending on the driving situation, a limit value for the contact pressure initiated by the driver can be set, and the autonomous transverse guidance is deactivated by the control unit only if this limit is exceeded. At this point, or if the above limit is exceeded, the driver takes over the task of the transverse guidance of the vehicle.

The introduction of said limit value means it is possible to advantageously prevent inadvertent touches, which are exercised with only a very slight pressure by the driver, from being interpreted by the control unit as a control transfer request by the driver and the driver assistance system from being incorrectly deactivated.

In an advantageous embodiment of the invention the said limit value of the contact pressure of the driver, above which a deactivation of the driver assistance system for autonomous transverse guidance takes place, can be adjusted or changed according to the driving situation.

The limit value can be set depending on the vehicle speed and, for example, can be increased with increasing vehicle speed. This is because at high speeds, for example during freeway driving, it is very important that contact with the steering wheel by the driver during autonomous transverse guidance of the vehicle only deactivates the driver assistance system if the driver actually intends to assume control over the transverse guidance task. If the limit value is increased, the driver must consequently hold the steering wheel somewhat more firmly. This is to ensure that no accidental or involuntary touching of the steering wheel by the driver takes place.

In addition, it is possible to adjust or change the said limit value on the basis of specific signals, such as if the driver assistance system prompts the driver to assume control over the transverse guidance of the vehicle. Thus, if a control transfer request exists, i.e. if the driver assistance system is already awaiting a response of the driver or contact with the steering wheel by the driver, then the limit value can be adjusted to a lower setting. The signal for the control transfer request on the part of the driver assistance system is then sent directly to the control unit, which decreases the limit value of the contact pressure accordingly and waits for the contact on the part of the driver. The transfer of control thus takes place faster and more reliably.

In a further advantageous embodiment, the said limit value can be adjusted or changed depending on environmental conditions, such as weather conditions or even road conditions, such as in the case of uneven, slippery or wet roads.

The pressure sensor device is positioned according to the invention on the rim of the steering wheel in such a way that an accidental touching of the steering wheel with other parts of the body apart from the hands, such as the legs or knees, is avoided and thus any accidental deactivation of the driver assistance system for transverse guidance of the vehicle is advantageously avoided. If therefore, during the autonomous transverse guidance of the vehicle, the driver accidentally touches the steering wheel, for example with his/her knee, on the outer surface of the steering wheel described as viewed from the steering wheel center point, at which there is no pressure sensor present, no signals will consequently be sent to the control unit and the driver assistance system for transverse guidance of the vehicle will not be deactivated.

The pressure sensor preferably consists of a material which emits an electrical signal under the action of pressure and constitutes a so-called intelligent material. The intelligent material fulfils the sensing function, while the implementation of the sensing signal is delegated to external controllers and power supplies. Examples of such a material are piezoelectric, magneto-rheological, electro-rheological or dielectric materials. Advantageously, the intelligent material is mounted over a wide area under the leather outer covering of the steering wheel rim, in the form of a film or a membrane. The exact points at which the film or membrane extends over the rim of the steering wheel is not limited, apart from the above-mentioned excluded outer area. Thus, the film can be attached, for example, only to an annular area on the driver-facing side of the steering wheel rim, or can extend over the entire surface of the steering wheel rim (except for the free area according to the invention).

For example, the pressure sensor device can be implemented from a piezoelectric material in the form of a film or a thin membrane layer and be mounted under the leather cover of the steering wheel rim. The mechanical deformation and/or elastic deformation of the membrane when the steering wheel rim is touched causes electrical signals to be generated. The contact pressure can therefore be measured in a technically simple way.

In a further advantageous embodiment, a dielectric elastomer in a film-like or membrane-like form is used as the pressure sensor for measuring the contact pressure. In the event of deformation under the application of the contact pressure the thickness of the elastomer film is reduced, while the area of the film increases. This produces an electrical capacitance increase, on the basis of which the pressure can be measured.

By changing the pressure sensitivity of the materials, it is then also possible to adjust the said limit value of the contact pressure depending on the driving situation.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
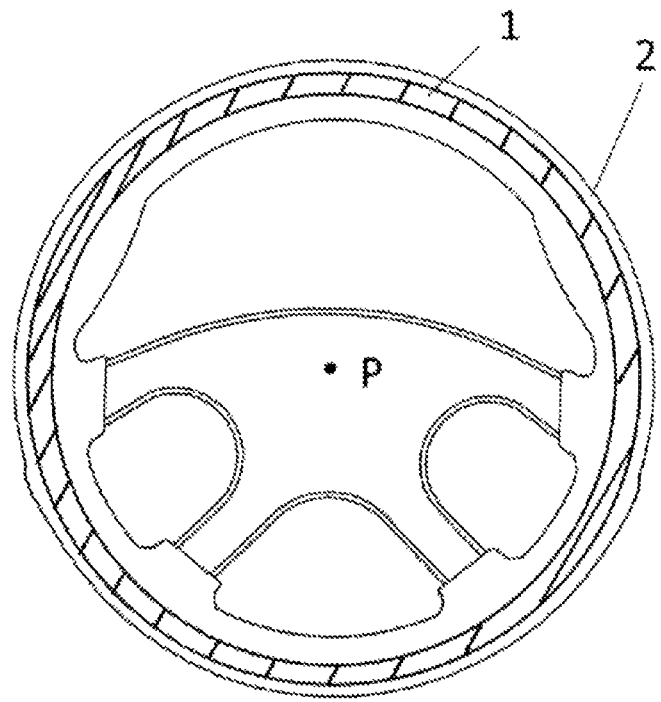
FIG. 1 shows a vehicle steering wheel in a plan view.

FIG. 1 shows a vehicle steering wheel in a plan view, wherein the pressure sensor device 1 according to the invention in this specific example is located as an annular film or membrane on the driver-facing side of the steering wheel rim 2.

Figure 2:
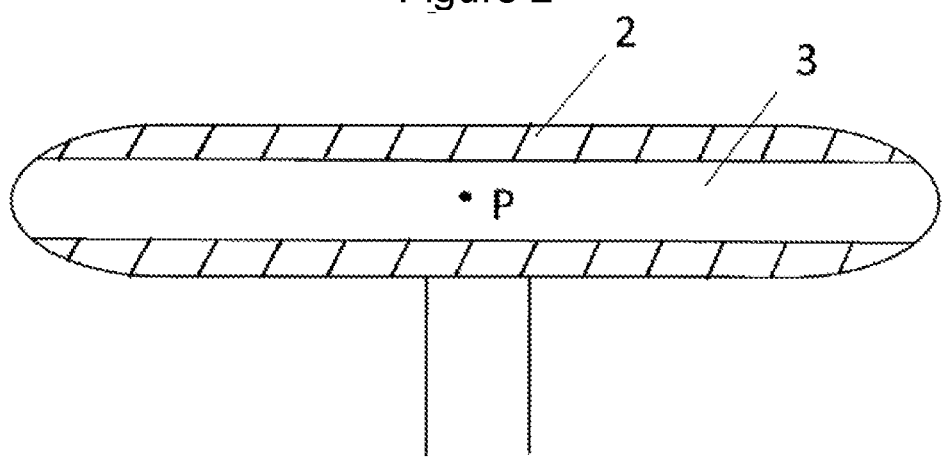
FIG. 2 shows a side view of a vehicle steering wheel.

FIG. 2 shows a schematic representation of the area 3 on the rim of the steering wheel, which is not covered by the pressure sensor device.

Figure 3:
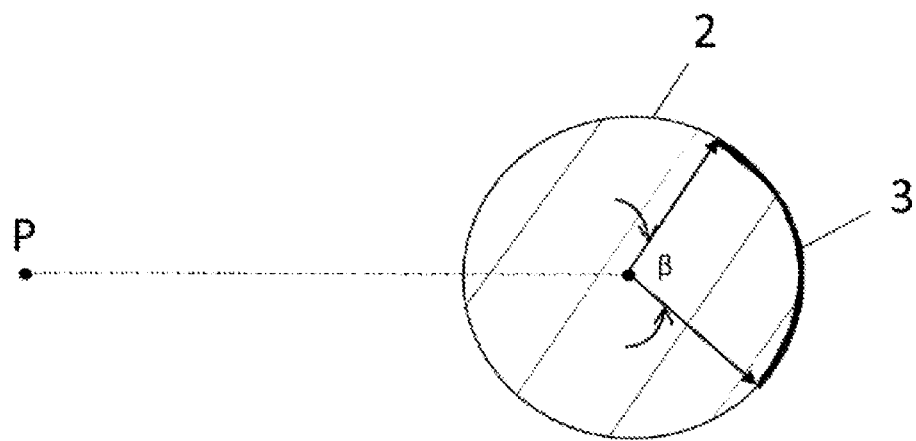
FIG. 3 illustrates an embodiment of the invention on the basis of a cross-sectional view of the steering wheel rim.

FIG. 3 shows, in a cross section of the steering wheel from FIG. 2, the area 3 of the surface of the steering wheel rim 2, which describes an approximately circular-segment-shaped arc which extends over a sector angle B on the order of magnitude of 90°, said arc being spaced apart as far as possible from the center point P of the steering wheel. Since the area 3 is frequently touched by other parts of the body than the hands, in particular by the legs or the knees of the driver, this area 3 is not covered by the pressure sensor device 1. This enables an unwanted deactivation of the driver assistance system for autonomous transverse guidance to be avoided.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for deactivating a driver assistance system for autonomous transverse guidance of a vehicle, the method comprising the acts of:
   detecting, via a sensor unit of the driver assistance system, contact with a steering wheel rim by a driver; and
   determining, via a control unit, a request by the driver to transfer from the autonomous transverse guidance into a manual transverse guidance based on detecting the contact, wherein
   the sensor unit comprises at least one pressure sensor, which extends at least over a portion of a surface of the steering wheel rim usually touched by hands of the driver, but which does not comprise an area of the surface of the steering wheel rim which, viewed in a cross section of the steering wheel rim, describes an approximately circular-segment-shaped arc extending over a sector angle ($\beta$) of the order of magnitude of 90°, which arc is spaced apart as far as possible from a center point of the steering wheel.

2. The method as claimed in claim 1, wherein
   the control unit deactivates the autonomous transverse guidance only when a contact pressure detected by the pressure sensor exceeds a limit value.

3. The method as claimed in claim 2, wherein
   the limit value is adjustable depending on a driving situation.

4. The method as claimed in claim 3, wherein
   the limit value is adjusted to a higher setting with increasing vehicle speed.

5. The method as claimed in claim 2, wherein
   the limit value is adjusted to a lower setting in an event of a control transfer request by the driver assistance system.

6. A device for deactivating a driver assistance system for autonomous transverse guidance of a vehicle, comprising:
   a steering wheel having a rim;
   a sensor unit of the driver assistance system, the sensor unit detecting contact with the rim of the steering wheel by a driver;
   a control unit of the driver assistance system, the control unit detecting, via the detected contact, a request by the driver to transfer from the autonomous transverse guidance into a manual transverse guidance, wherein
   the sensor unit comprises at least one pressure sensor, which extends at least over a portion of a surface of the steering wheel rim usually touched by hands of the driver, but which does not comprise an area of the surface of the steering wheel rim which, viewed in a cross section of the steering wheel rim, describes an approximately circular-segment-shaped arc extending over a sector angle ($\beta$) of the order of magnitude of 90°, which arc is spaced apart as far as possible from a center point of the steering wheel.

7. The device as claimed in claim 6, wherein
   the pressure sensor is made of a material which emits an electrical signal under action of pressure.

8. The device as claimed in claim 7, wherein
   the material of the pressure sensor is a magneto-rheological, an electro-rheological, a dielectric or a piezoelectric material.

9. The device as claimed in claim 8, wherein
   the pressure sensor is a film or a plurality of sensors is integrated into a film.

10. The device as claimed in claim 7, wherein
    the pressure sensor is a film or a plurality of sensors is integrated into a film.

* * * * *